United States Patent [19]

Seebinger

[11] 4,116,302

[45] Sep. 26, 1978

[54] HORN LOUDSPEAKER

[75] Inventor: Frederick L. Seebinger, Smoke Rise, N.J.

[73] Assignee: American Trading and Production Corp., Baltimore, Md.

[21] Appl. No.: 778,813

[22] Filed: Mar. 17, 1977

[51] Int. Cl.[2] ........................ H05K 5/00; G10K 11/00

[52] U.S. Cl. .................................. 181/192; 181/194; 116/142 R; 340/388

[58] Field of Search ............... 181/192, 193, 194, 190, 181/185, 159; 116/142 R; 340/388, 391

[56] References Cited

U.S. PATENT DOCUMENTS

| | | | |
|---|---|---|---|
| 20,961 | 7/1858 | Staehlen | 181/192 |
| 1,542,906 | 6/1925 | Pace | 181/192 |
| 1,666,057 | 4/1928 | Grissinger | 181/192 |
| 1,722,220 | 7/1929 | Hwilbert | 181/192 |
| 1,832,763 | 11/1931 | Campbell | 181/193 |
| 2,803,004 | 8/1957 | White | 340/388 |

FOREIGN PATENT DOCUMENTS

| | | | |
|---|---|---|---|
| 192,172 | 1/1923 | United Kingdom | 181/195 |

*Primary Examiner*—Stephen J. Tomsky
*Attorney, Agent, or Firm*—Blum, Moscovitz, Friedman & Kaplan

[57] ABSTRACT

A horn loudspeaker construction wherein an integrated sound chamber and horn assembly is provided by two uniquely configured members that form a highly efficient horn loudspeaker capable of being utilized within a four-inch type electrical box. The horn loudspeaker includes a sound chamber for receiving a magnetic loudspeaker driving assembly and diaphragm. The sound chamber also includes a sound opening having a predetermined acoustic orientation. A first horn stage has a first opening acoustically coupled to the sound opening and is characterized by a flare rate that expands as the first horn stage extends away from the sound opening. The first stage includes an acoustical orientation at the output end that is at least 90° disposed from the acoustical orientation of the sound opening. An output horn stage is acoustically coupled at a first end thereof to the output end of the first horn stage and is provided with a flare rate that expands as the output horn stage extends away from the first stage to define a horn output. The output stage is particularly characterized by the acoustical orientation being varied as the flare rate expands so that the acoustical orientation at the horn output is at least 90° disposed fo the acoustical orientation formed by the acoustic coupling of the first horn stage and the output horn stage.

8 Claims, 7 Drawing Figures

FIG.1
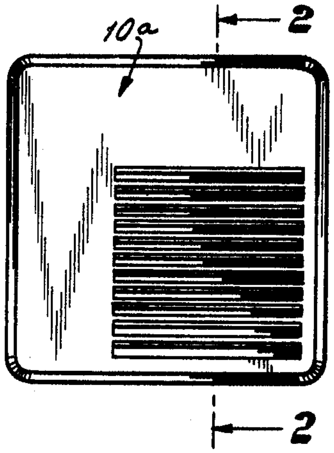
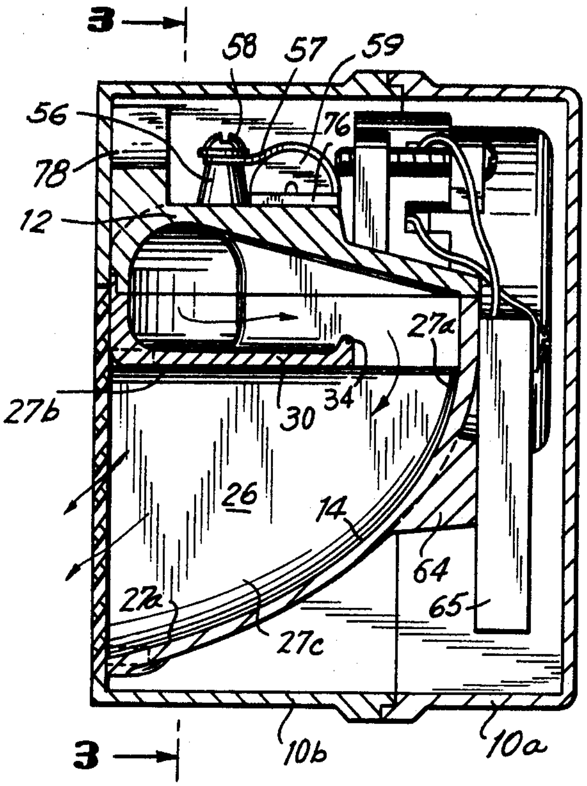
FIG.2
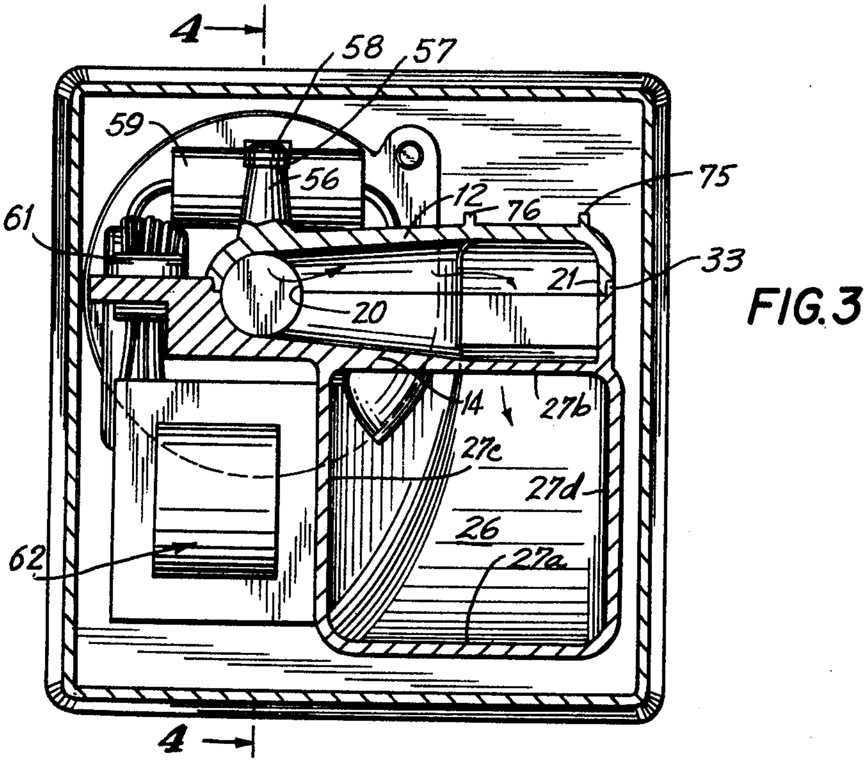
FIG.3

FIG.4
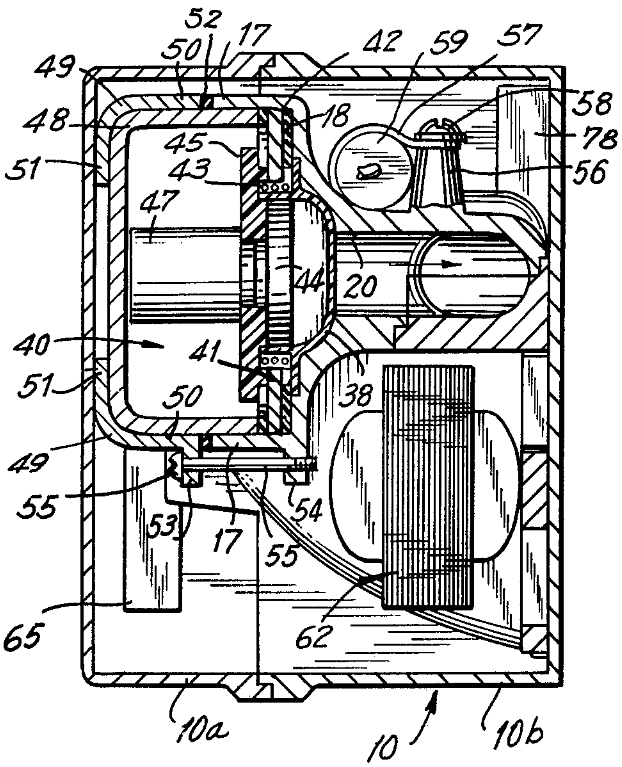
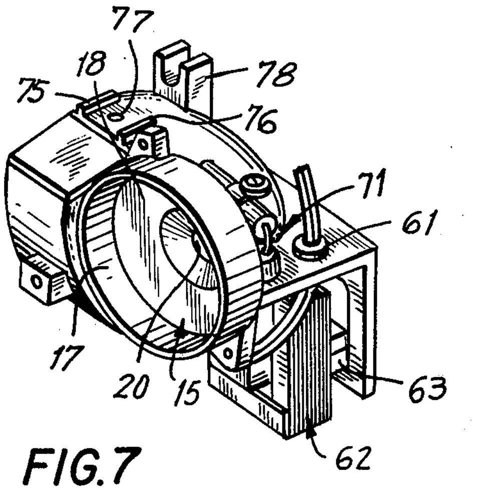
FIG.7
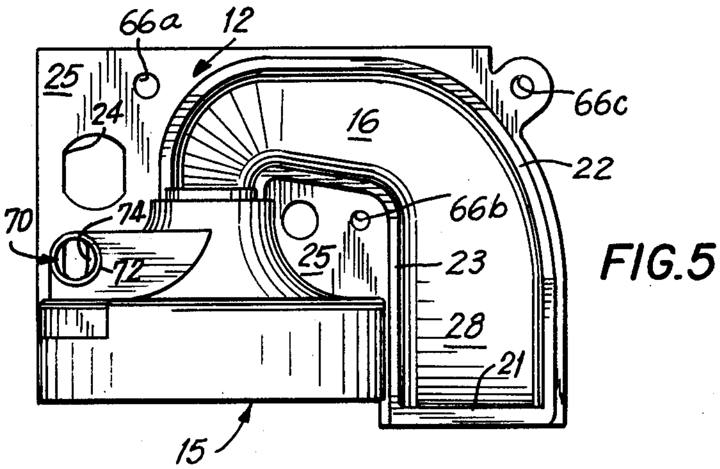
FIG.5
FIG.6
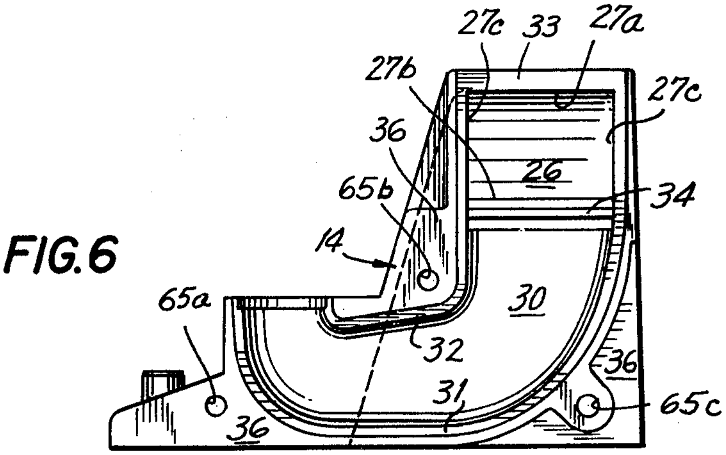

HORN LOUDSPEAKER

BACKGROUND OF THE INVENTION

This invention is directed to a miniaturized horn loudspeaker, and in particular to a miniaturized horn loudspeaker having an integrated sound chamber and horn assembly essentially formed, in an exemplified embodiment, of two die castings, the horn assembly being folded into a structurally curved, but non-acoustically interfering, expanding horn.

While specific types of signalling devices utilized in life safety systems, such as fire alarms, burglar alarms, etc., have taken on various forms, horn loudspeakers capable of producing voice information and/or signalling information, are preferred. Moreover, where size is not determinative, horn loudspeakers are often selected to replace cone loudspeakers, mechanical sounding devices and other vibrating and signalling devices. Cone loudspeakers do not provide a sufficiently loud sound signalling output, are subject to fatigue, have a shorter useful life than a horn loudspeaker when operated under similar conditions, and are not satisfactorily resistant to environmental elements. Mechanical sound signalling output devices are not capable of providing voice information. However, due to the excessive size, manufacturing difficulties, installation difficulties and loss of performance efficiency, when conventional horn loudspeakers are miniaturized, horn loudspeakers have been found to be unacceptable for use in a four-inch electrical box of the type typically utilized to house conventional life safety system signalling devices. Accordingly, a miniaturized horn loudspeaker that is acoustically efficient, element resistant, temperature rated, easy to manufacture and install, and is sufficiently small to permit same to be installed in what is customarily referred to as a four-inch electrical box, is provided.

SUMMARY OF THE INVENTION

Generally speaking, a horn loudspeaker having an integrated sound chamber and horn assembly, formed in an exemplified embodiment from two die castings, is provided. The sound chamber is adapted to receive a diaphragm and magnetic loudspeaker driver assembly. The sound chamber also forms an opening having a predetermined acoustic orientation. A first horn stage is provided with a first opening that is acoustically coupled to the sound opening, the first horn stage having a flare rate that expands as the first stage extends away from the sound opening. The first horn stage further includes a restricted portion that defines a further opening. The restricted portion of first stage is also provided with an acoustical orientation at the further opening that is at least 180° disposed from the predetermined acoustical orientation of the sound opening. An output horn stage is acoustically coupled at a first end thereof to the first horn stage, the output horn stage having a flare rate that expands as the second stage extends away from the first stage to define a horn output. The second stage is characterized by an acoustical orientation which varies as the flare rate expands, so that the acoustical orientation, at the horn output, is at least 90° disposed with respect to the acoustical orientation at the acoustical junction between the first horn stage and second horn stage.

Thus, it is an object of the instant invention to provide a miniaturized, simple to manufacture, horn loudspeaker having low distortion, environment resistance and high efficiency.

Another object of the instant invention is to provide a miniaturized horn loudspeaker having an integrated sound chamber and horn assembly, formed of two die castings, wherein the horn assembly is folded into a non-acoustically interfering expanding horn.

Still another object of the instant invention is to provide a miniaturized horn loudspeaker communication and signalling system that can readily replace a mechanical and/or vibratory signalling device disposed in a four-inch electrical box.

Still a further object of the instant invention is to provide a miniaturized horn loudspeaker for producing voice information or signalling information, or both voice information and signalling information, concurrently.

Still a further object of the instant invention is to provide an improved miniaturized horn loudspeaker for use in alarm signalling systems, intercom systems, paging systems and the like.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 1 is an elevational view of a four-inch type electrical box housing a miniaturized horn loudspeaker constructed in accordance with the instant invention;

FIG. 2 is a sectional view taken along line 2—2 of FIG. 1;

FIG. 3 is a sectional view taken along line 3—3 of FIG. 2;

FIG. 4 is a sectional view taken along line 4—4 of FIG. 3;

FIG. 5 is a plan view of a die casting constructed in accordance with the preferred embodiment of the instant invention;

FIG. 6 is a plan view of a further die casting constructed in accordance with the preferred embodiment of the instant invention; and FIG. 7 is a perspective view of the miniaturized horn loudspeaker assembly of the instant invention.

DETAILED DESCRIPTION OF THE PREFERRED EMBODIMENT

As is illustrated in FIGS. 1 through 7, the miniaturized horn loudspeaker of the instant invention is particularly characterized by forming a highly efficient, water resistant, easy to manufacture and install, miniaturized horn loudspeaker from two die castings. As is discussed in greater detail below, both die casting members, in principle, form a horn loudspeaker by folding the horn into a bent configuration that provides substantially the same acoustical efficiency as a conventional elongated straight horn loudspeaker in a considerably reduced space. Accordingly, as utilized herein, the term "acoustical orientation" defines what is ordinarily referred to as the axial direction of a conventional horn. Also, the term "expanding flare rate", as utilized herein, refers to the substantially exponential horn characteristic of the respective horn stages, when the cross-sectional area of each horn stage increases with the acoustical orientation of the horn.

Reference is made to FIGS. 1 and 2 wherein a 4-inch electrical box, generally indicated as **10*a* and an electrical box cover 10*b***, are depicted. Such 4-inch electrical boxes have been utilized indoors and outdoors to house mechanical and vibrating sound signalling and voice communication devices. It is noted that 4-inch electrical boxes of the type described herein are well known in the art and, in fact, have an outside dimension that is 4¼ inches square, and with the cover therefor, a usual depth of less than 4 inches. However, it is also noted that the interior of the 4-inch electrical box provides a space for a sound signalling device such as the miniaturized loudspeaker of the instant invention, that is slightly less than 4-inches square and with the cover thereon, 3½ inches deep.

Reference is now made to FIGS. 2 through 7, wherein a miniaturized horn loudspeaker, constructed in accordance with a preferred embodiment of the instant invention, is depicted. The miniaturized loudspeaker is characterized by a small sized, simple to install, element resistant, integrated sound chamber and horn assembly formed from two die castings, a sound chamber die casting 12, particularly illustrated in FIG. 5, and an output horn die casting 14, particularly illustrated in FIG. 6.

The sound chamber die casting 12, is comprised of a sound chamber, generally indicated at 15, and a first half-wall 16. As is best illustrated in FIG. 7, the sound chamber is formed by a cylindrical wall 17, a diaphragm support wall 18 and a sound opening 20. The sound chamber 15 is adapted to receive a diaphragm assembly and loudspeaker magnetic drive assembly in a conventional manner, to be discussed in greater detail below.

The first half-wall 16 is shaped to define a first loudspeaker horn stage having a continuously increasing expansion rate over the length thereof, as the half-wall extends from the sound opening 20 to projecting end wall 21. Additionally, outer projecting wall 22 and inner projecting wall 23 extend from the sound opening 20 in the sound chamber, to projecting end wall 21. The respective projecting walls 23 and 23 and end wall 21 are raised from the surface 25 of die casting 12, and as explained in greater detail below, when disposed in juxtaposed relationship with a second half-wall formed in output horn die casting 14, define a non-acoustically interfering expanding first horn stage along the entire acoustical dimension defined thereby. Also, as is detailed below, the surface 25 of the sound chamber die casting 12 further defines, among other openings, a strain relief opening 24, which opening permits a strain relief to secure all of the wires in the loudspeaker and avoid damage to the wires during installation of the horn loudspeaker assembly in a 4-inch electrical box **10*a***.

An elongated terminal through hole, generally indicated at 70, is formed in the sound chamber die casting to receive a round insulated terminal assembly 71 (illustrated in FIG. 7) for coupling the voice coil leads to the loudspeaker drive circuitry. The terminal through hole is defined by a raised annular wall 72 on both surfaces of the die casting and an inward step 74 positioned in the through hole for anchoring the terminal assembly 71 therein.

The output horn die casting 14, as is best illustrated in FIGS. 2 and 3, defines curved output horn stage 26, which stage forms an increasing expansion rate over the entire acoustical dimension thereof. The output horn stage 26 is formed by horn walls **27*a*, 27*b*, 27*c* and 27*d*, which walls, as illustrated in FIGS. 3 and 4**, define a continuously curved, acoustically non-interfering output horn stage.

Output horn die casting 14 further includes a second half-wall 30, defined by outer recessed wall 31, inner recessed wall 32 and recessed end wall 33. When the output horn die casting 14 is secured in juxtaposed relationship to the sound chamber die casting 12, the respective first horn stage half-wall 16 and the output horn stage half-wall 30 form a structurally curved first horn stage. As is illustrated in FIG. 6, recessed walls 31 and 32 define a continually increasing flare rate along the acoustical dimension of the second half-wall 30, as second half-wall 30 extends from sound chamber 20 to the output horn stage 26. An acoustical compensating ridge 34 is disposed at the position that the first horn stage is acoustically coupled to the output horn stage in order to reduce reflective interference at the sharp 90° turn, in the acoustical orientation defined by the acoustic coupling of the first horn stage with the output horn stage. Walls 31, 32 and 33 are recessed from meeting wall 36 in order to receive the projecting walls 22, 23 and 21 of the sound chamber die casting 12, when meeting wall 36 is placed flush with surface 25. When the sound chamber die casting 12 and output horn die casting 14 are secured together, by appropriate means, so that the projecting side walls and end wall of the sound chamber die casting are projecting into the recessed side walls and end walls of the output horn die casting, an integrated sound chamber and horn assembly, formed of two die castings, for use in 4-inch electrical box **10*a***, is provided.

Reference is now made to FIG. 4, wherein the elements comprising the diaphragm and magnetic loudspeaker driver assembly, generally indicated as 40, particularly adapted to be disposed in the sound chamber 15, are depicted. The diaphragm consists of a molded cone 38 and bakelite alignment ring 42 positionally secured against the diaphragm support wall 18 by annular top plate 41. A voice coil 43, having leads for coupling the driver voice coil to the assembly, is wrapped around an annular wall of the molded cone that is directed away from the diaphragm support wall 18 in a conventional manner. A non-magnetic, preferably plastic, positioning element 45, supports a pole cap 44 in a spaced apart relationship with top plate 41 to dispose the voice coil therebetween and dispose the pole cap 44 in abutting relationship with a pole magnet 47 utilized to effect driving of the loudspeaker assembly. The loudspeaker assembly further includes a magnetic pot 48, which pot is secured to the sound chamber 15, by a clamp 49 having a cylindrical wall 50 and an annular lip 51. Cylindrical wall 50 supports at least two screw receiving projections 53. The cylindrical wall 17, of the sound chamber 15, also includes screw receiving projections 54 having a threaded opening therein, for receiving clamping screws 55 inserted through projection 53 to thereby secure the magnetic driver assembly in the sound chamber and provide a water tight magnetic driver assembly that operates in a conventional manner. The water tight seal is effected by disposing an annular rubber gasket 52 between clamp 49 and cylindrical wall 17 so that tightening of clamping screws 55 will effect a water seal therebetween.

In order to further facilitate the assembly of the miniaturized loudspeaker and installation of same in a 4-inch electrical box, the die castings are formed to provide means for readily anchoring the operative element of the loudspeaker assembly to the respective die castings to form a completed horn loudspeaker assembly. For example, a mounting assembly comprised of post 56, bracket 57 and screw 58 can be utilized to positionally secure to the sound chamber die casting a large condenser 59, as illustrated, or alternatively, if desired, a printed circuit board. As noted above, strain relief opening 24 is provided in the surface 25 of sound chamber die casting 12 for receiving a strain relief 61, which strain relief secures the wires for coupling the loudspeaker driver assembly to appropriate circuitry for energizing and activating same and prevents the wires from being damaged when the loudspeaker assembly is installed in a 4-inch electrical box. Also, a variable tap line matching transformer, also referred to as a line-to-voice coil transformer, generally indicated as 62, is positioned by positioning posts 63, formed on output horn die casting 14, the positioning posts being provided with a threaded opening to receive a screw (not shown) and thereby securely position the line-to-voice coil transformer in the loudspeaker assembly. The positioning post can also be used for securing a printed circuit board to the loudspeaker assembly. Also, a terminal strip mounting bracket 64 is formed on the output horn die casting to support a screw terminal strip 65, for mounting optional items in the loudspeaker assembly, such as voice detection wires and the like. Additionally, a further terminal strip mounting assembly is provided on the outer surface of half-wall 16, and is formed of two mounting ribs 75 and 76, and an opening 77 for securing a further terminal strip thereto, if such a terminal strip is desired.

Sound chamber die casting 12 is provided with screw receiving openings *66a*, *66b* and *66c*, which openings align with threaded screw receiving openings *65a*, *65b* and *65c* in the output horn die casting, to thereby permit threaded screws (not shown) to be inserted through the respective screw receiving openings into the threaded screw receiving openings to thereby secure the respective die castings together. Additionally, U-shaped projecting elements 78, or other appropriate means, are provided, on the respective die castings for positionally referencing the loudspeaker assembly with respect to the cover for the 4-inch electrical box. Holes can be provided in the die castings for receiving positioning pins in the 4-inch electrical box and cover therefor, in order to further effect self-alignment of the loudspeaker assembly during installation of same in the 4-inch electrical box.

Horn loudspeaker design requires that the horn have an increasing flare rate over a predetermined distance. Accordingly, the instant invention has provided a non-acoustically interfering curved horn, that provides a sufficient acoustical length to yield a highly efficient loudspeaker. The sound opening 20, in the sound chamber, is acoustically perpendicularly oriented with respect to the front surface of the electrical box and opens into the first horn stage defined by first half-wall 16 and second half-wall 30, to define a substantially U-shaped (in plan view) first horn stage. As noted above, the respective side walls continually flare away from each other to provide the first horn stage with an increasing flare rate until the walls reach a restricted portion 28. It is noted that a restricted portion 28, of the first horn stage half-wall 16, is slanted inwardly in order to redirect the sound around the acoustical compensating projection 34 and into the output horn stage 26. The sound is acoustically redirected 180° through the first horn stage, and is thereafter deflected by slanted wall portion 28 around the acoustical compensating ridge into the output horn stage 26, whereby the direction of the sound is once again reoriented by 90° at the opening of the output horn stage. Thereafter, the direction of the sound is again reoriented by 90° in the output horn stage. Accordingly, by utilizing two die castings, an integrated sound chamber and horn assembly, that can be utilized in a 4-inch electrical box, is provided.

A miniaturized, high performing loudspeaker that permits the sounds of signalling devices of the mechanical or vibrator type and/or voice information to be efficiently produced and is manufacturable and installable with high reliability, is therefore provided. Moreover, the unique two-piece construction, whether formed by die casting both members, molding both members or utilizing any other forming technique, makes it difficult to damage the speaker assembly during the course of installation and during the useful life of the horn loudspeaker.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also understood that the following claims are intended to cover all of the generic and specific features of the invention herein described and all statements of the scope of the invention which, as a matter of language, might be said to fall therebetween.

What is claimed is:

1. A horn loudspeaker having an integrated sound chamber and horn assembly comprising a sound chamber adapted to receive a diaphragm and magnetic loudspeaker driver assembly, said sound chamber forming a sound opening having a predetermined acoustic orientation, a first horn stage having a first opening acoustically coupled to said sound opening, said first horn stage including a first portion having a flare rate that expands as said first stage extends away from said first opening and a restrictive portion defining a further opening, said first stage having an acoustical orientation, at said restrictive portion, that is turned at least 180° in a first plane from the predetermined acoustical orientation of said sound opening, and an output horn stage acoustically coupled at a first end thereof to said restrictive portion of said first horn stage to define an acoustical junction therebetween, said output horn stage having a flare rate that expands as the output stage extends away from said acoustical junction between said first stage and said second stage to define a horn output at the other end of said output horn stage, said second stage having a continuously changing acoustical orientation along the lengthwise extent thereof that is varied as said flare rate expands, so that the acoustical orientation at said horn output is turned at least 90° in a plane perpendicular to said first plane so that the output of said second horn stage is oriented in the same direction as the predetermined acoustical orientation of said sound opening.

2. A horn loudspeaker as claimed in claim 1, wherein said acoustical junction between said further opening of said first horn stage and the output horn stage effects a further reorientation of said acoustical orientation at the input of said output horn stage of 90° with respect to said further opening of said first horn stage.

3. A horn loudspeaker as claimed in claim 2, wherein said integrated sound chamber and horn assembly is comprised of first and second joined members, said first member forming said sound chamber and a half-wall for forming said first horn stage, said second member forming said output horn stage and the other half-wall of said first horn stage when said respective half-walls are secured together.

4. A horn loudspeaker as claimed in claim 3, wherein said first and second members are die castings.

5. A horn loudspeaker as claimed in claim 1, wherein said restricted portion of said first horn stage includes acoustical compensation means disposed proximate to the position where said restrictive portion of said first horn stage is acoustically joined to the input of said second stage to direct the sound into said output horn stage, said acoustical compensation means being adapted to reduce reflective interference at the acoustical junction defined thereat.

6. A horn loudspeaker comprised of a first die casting and a second die casting, said die castings being adapted to be positionally secured in juxtaposed relationship to define an integrated horn assembly, said first die casting forming a sound chamber having a first opening for receiving a diaphragm and loudspeaker magnetic driver assembly, and a smaller second opening, said second opening defining the entrance to said horn assembly, said first die casting further defining a first half-wall providing a substantially U-shaped acoustical conduit having an increasing flare rate as the U-shaped conduit extends from said second opening to a restricted conduit portion, said restricted conduit portion defining an acoustical path turned 180° in a first plane with respect to said second opening, said second die casting forming an output horn, said output horn having an increasing flare rate and an acoustical orientation that turns 90° in a plane perpendicular to said first plane as the flare rate increases so that the acoustical orientation of the output of said horn is oriented in the same direction as said second opening when said respective first and second die castings are disposed in juxtaposed relationship to thereby define an intermediate horn stage between said second opening of said sound chamber and said output horn.

7. A horn loudspeaker as claimed in claim 6, wherein said second half-wall is acoustically coupled through an opening to said restricted conduit portion of said intermediate horn stage, said acoustical coupling changing the acoustical orientation between said restricted portion of said intermediate horn stage and output horn by 90°.

8. A horn loudspeaker as claimed in claim 7, wherein said restrictive conduit portion includes a ridge formed on said second half-wall for providing acoustical compensation, said ridge being positioned proximate to said opening defining said acoustical coupling, a portion of said first half-wall opposed to said opening in said second half-wall being slanted toward said opening to deflect sound energy therein.

* * * * *